United States Patent [19]

Takeuchi

[11] 4,144,106
[45] Mar. 13, 1979

[54] MANUFACTURE OF AN I²L DEVICE UTILIZING STAGED SELECTIVE DIFFUSION THRU A POLYCRYSTALLINE MASK

[75] Inventor: Hiromitsu Takeuchi, Nara, Japan

[73] Assignee: Sharp Kabushiki Kaisha, Osaka, Japan

[21] Appl. No.: 820,319

[22] Filed: Jul. 29, 1977

[30] Foreign Application Priority Data

Jul. 30, 1976 [JP] Japan .................................. 51-92575

[51] Int. Cl.² .................... H01L 21/20; H01L 21/225
[52] U.S. Cl. ................................. 148/175; 29/577 R; 29/578; 148/174; 148/187; 148/188; 357/35; 357/36; 357/46; 357/59; 357/92; 427/86
[58] Field of Search ............... 148/174, 175, 187, 188; 29/577, 578; 357/35, 36, 46, 59, 92; 427/86

[56] References Cited

U.S. PATENT DOCUMENTS

| 3,502,517 | 3/1970 | Sussman | 148/188 X |
| 3,657,612 | 4/1972 | Wiedmann | 357/48 X |
| 3,787,253 | 1/1974 | Ashar | 357/48 X |
| 3,904,450 | 9/1975 | Evans et al. | 148/175 |
| 3,922,565 | 11/1975 | Berger et al. | 357/92 X |
| 4,029,527 | 6/1977 | Glasl et al. | 148/187 |
| 4,058,419 | 11/1977 | Tokumaru et al. | 148/188 X |
| 4,064,526 | 12/1977 | Tokumaru et al. | 357/36 X |

OTHER PUBLICATIONS

Blum et al., "Monolithic Planar . . . One Diffusion Step," IBM Tech. Discl. Bull., vol. 14, No. 6, Nov. 1971, p. 1808.

Carlsen, G. S., "Multiple Diffusion . . . from Single Diffusion," Ibid, vol. 9, No. 10, Mar. 1967, pp. 1456-1458.

Primary Examiner—L. Dewayne Rutledge
Assistant Examiner—W. G. Saba
Attorney, Agent, or Firm—Birch, Stewart, Kolasch and Birch

[57] ABSTRACT

During the manufacture of an I²L device, to achieve diffusion steps for a collector region and a collar region at the same time, polycrystal silicon is deposited over the whole surface of the collector region and then an impurity is diffused simultaneously into the collector region and the collar region.

6 Claims, 9 Drawing Figures

FORMATION OF WINDOW FOR P DIFFUSION OF COLLECTOR REGIONS

FORMATION OF WINDOW FOR COLLAR REGIONS

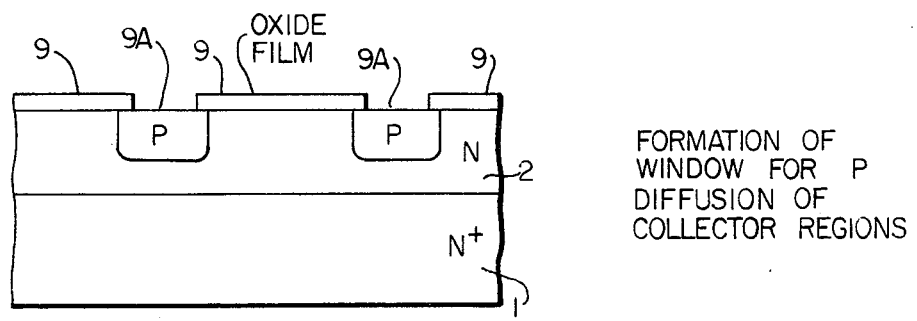
FIG. 6A — FORMATION OF WINDOW FOR P DIFFUSION OF COLLECTOR REGIONS
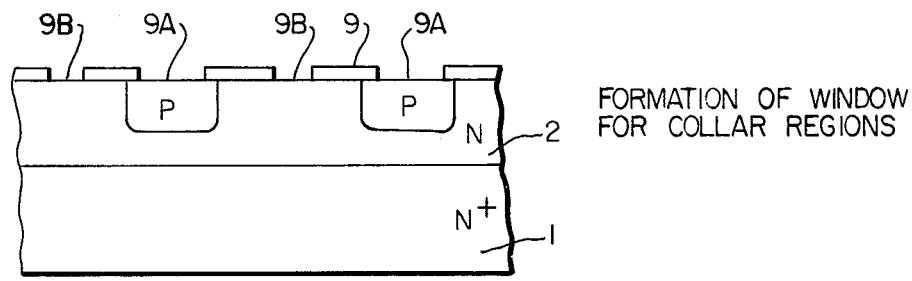
FIG. 6B — FORMATION OF WINDOW FOR COLLAR REGIONS
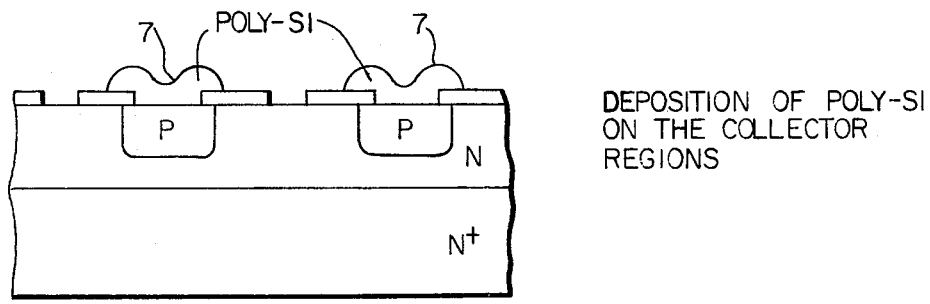
FIG. 6C — DEPOSITION OF POLY-SI ON THE COLLECTOR REGIONS
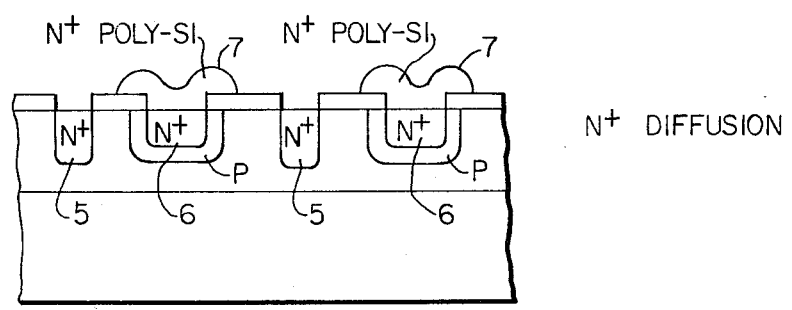
FIG. 6D — $N^+$ DIFFUSION

MANUFACTURE OF AN I²L DEVICE UTILIZING STAGED SELECTIVE DIFFUSION THRU A POLYCRYSTALLINE MASK

BACKGROUND OF THE INVENTION

This invention relates to a bipolar device and more particularly to a method of manufacturing an integrated injection logic device (referred to as "I²L" hereinafter).

It is well known that IC's are categorized into bipolar devices and MOS devices and both cover different ranges of applications dependent upon the respective inherent features. It is much more difficult to incorporate bipolar devices onto LSI chips than for MOS devices because of its complexity in construction.

However, the recent development of I²L devices provides bipolar devices with access to large scale circuit integration. The I²L device is a gate circuit composed of complementary transistors. As shown by FIG. 1 of a basic circuit diagram, a pnp transistor serves as a source of current and a load while an npn transistor serves as an inverter and has multi-collector outputs.

To complete the manufacture of the I²L device, an N-type epitaxial layer is first deposited over an N⁺substrate or an N⁺buried layer. A P-type impurity is then diffused into a region corresponding to the base of the inverter transistor and a region corresponding to the emitter of the injector pnp transistor. N⁺diffusion corresponding to the multi-collector of the inverter is effected within the base region. Subsequently, a surface isolation is removed and internal connections are provided for attachment of electrodes.

Nevertheless, the performance of the resulting I²L device is not good while not only the construction but also the manufacture procedure are considerably simplified. N⁺collar diffusion which surrounds the base region is needed to meet performance requirements resulting in a one-step increase in the diffusion and masking process.

Attempts have been made to effect the above-mentioned N⁺ collar diffusion and the N⁺multi-collector diffusion at the same time. In this case, an increase in the mask registration step and the diffusion step is avoided. However, it is not expected that the upward current gain is increased because of provision of the collar.

For example, in case of an I²L device having an N⁺collector but not an N⁺collar diffusion layer, a ratio of upward current gain Bu to downward current gain Bf is depicted by the curve (1) in FIG. 2. In the case where the N⁺collector diffusion and the N⁺collar diffusion are effected independently of each other, the gain ratio is represented by the curve (2). Curve (3) shows the gain ratio of the device where the N⁺collector and the N⁺collar are simultaneously formed. In other words, the deeper the diffusion of the collector (the higher Bf), the greater the advantage of the collar, followed by an increase in the upward current gain Bu. However, the curve (3) in FIG. 2 does not conform to the curve (2) and thus, does not achieve the performance of curve (2).

According to a preferred method of the present invention, the above-discussed relationship is improved as shown by the curve (4) to approach the performance of the curve (2). Higher downward current gain Bf is needed to obtain a given upward current gain Bu.

For example, when it is desired to obtain Bu beyond the line B of FIG. 2, the curve (1) needs the highest value of Bf for the curves (3), (4) and (2), respectively.

As stated briefly, the diffusion process of the present invention results in the curve (4) which substantially conforms to the curve (2) on the line B. Since no emitter-to-collector breakdown voltage is reduced when the upward current gain is high, it is required that the breakdown voltage be above a power supply voltage.

BRIEF DESCRIPTION OF THE DRAWINGS

Other objects and novel features of the present invention as set forth in the appended claims and the present invention as to its organization and its mode of operation will best be understood from a consideration of the following detailed description of the preferred embodiments taken in connection with the accompanying drawings, wherein:

FIGS. 6A to 6D is a step-by-step illustration of a preferred method of the present invention.

DETAILED DESCRIPTION OF THE INVENTION

Figure 3:
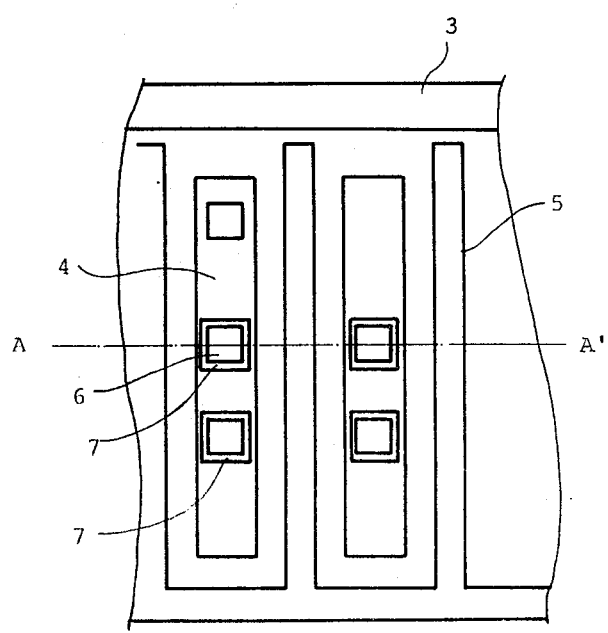
FIG. 3 is a plan view for explanation of a method of manufacturing I²L devices according to the present invention.
Figure 4:
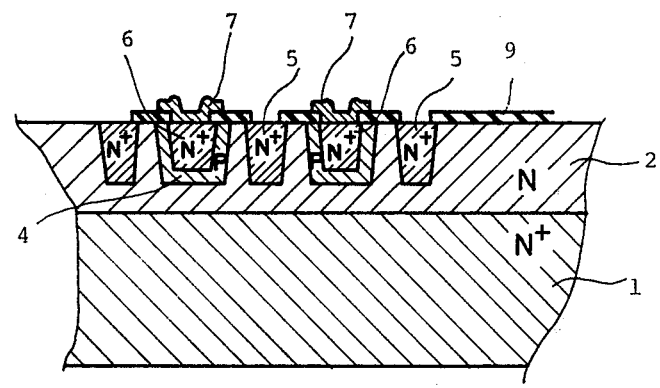
FIG. 4 is a cross-sectional view taken along the A–A' line of FIG. 3.

FIG. 3 is a plan view of an I²L device embodying the present invention and FIG. 4 is a cross-sectional view taken along the line A–A' of FIG. 3.

First of all, on a P-type semiconductor substrate (for example, a P-type silicon substrate diffused with an impurity such as As or Sb) or an N⁺substrate there is deposited an N-type epitaxial layer 2. The thickness-to-resistance ratio of the epitaxial layer 2 are determined by electric characteristics required for the I²L device, for example the maximum permissible voltage.

Under these circumstances, an oxide layer is then established by thermal oxidization and openings are formed in a desired pattern by a conventional photographic etching method. P⁺diffusion is effected for isolation only in case of a P⁺substrate. P⁺diffusion is not needed when the N epitaxial layer 2 is deposited on the N⁺substrate 1. P⁺diffusion is carried out within an oxidizable atmosphere such that an oxide layer is formed thereon. After effecting the P⁺diffusion, openings are formed in the oxide layer for the purpose of effecting N⁺diffusion by a conventional photographic etching method or the like. This may be carried out in advance of the P⁺diffusion (isolation).

Figure 5:
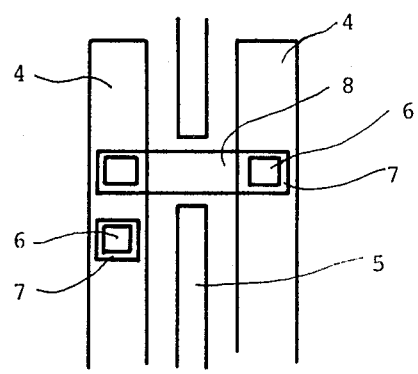
FIG. 5 is a plan view of another embodiment of the present invention.

In the method of the present invention, N⁺collar 5 of FIGS. 3 to 5 is made during the collector diffusion procedure. As illustrated in FIG. 6A when using an N⁺substrate 1, an oxide layer 9 is deposited over the epitaxial N layer 2 on the substrate 1 and openings 9A are formed in a manner to correspond to the desired locations of the emitter of injector 3 and the base 4 thereof. Thereafter, a P-type impurity is diffused through the openings. In the given example, diffusion depth is approximately 2.5μm and sheet resistance after diffusion is 200Ω/□.

Subsequent to this, openings 9B are formed as illustrated in FIG. 6B in a manner to correspond to the locations of the N⁺collar 5 for the purpose of N⁺diffusion of the collector and the collar regions. According to the method of the present invention, polycrystal silicon 7 is deposited by a chemical gas-phase growth method or an evaporation method prior to the N+ diffusion as illustrated in FIG. 6C. The polycrystal silicon is selectively removed in a manner to completely cover the area of the collector 6 by use of a proper mask and a conventional photographic etching method. Thereafter as illustrated in FIG. 6D, by diffusion of an impurity for example phosphorus (P) there are deposited the collar diffusion layer 5 of 2.5μm deep and the collector diffusion layer 6 of 2.0μm. A difference in the diffusion depth between the collector 6 and the collar 5 is controllable by the thickness of the polycrystal silicon 7 (for example, polysilicon) and various conditions of the impurity diffusion procedure.

Figure 1:
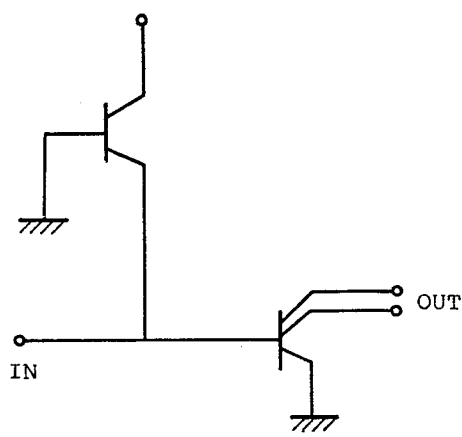
FIG. 1 is a basic circuit diagram of an I²L device.
Figure 2:
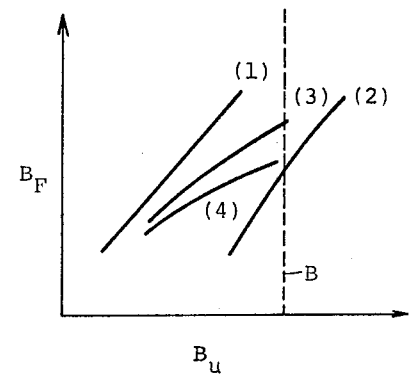
FIG. 2 is a diagrammatic chart showing performance characteristics for devices produced by different methods of manufacturing I²L devices.

As a result, the $I^2L$ device with the performance of curve (4) of FIG. 2 and the accompanying improved upward current gain is obtained.

An oxidizable atmosphere is used during the diffusion of the collector 6 and the collar so that a thermal oxide layer is formed thereover. In this case, attention is paid to preclude oxidation of all of the polycrystal silicon 7 on the collector 6. Alternatively, the diffusion of the collector and the collar may be carried out within an inert atmosphere and then the oxide layer would be formed by a chemical gas-phase growth method.

Finally, the oxide layer is provided with openings for establishment of electrodes and then metal material such as Al is deposited by a conventional photographic etching method. Meanwhile, as shown in FIG. 5, a portion of the N+ collar 5 is removed (by a glass mask pattern) to make it possible to use the polycrystal silicon 8 as a wiring means. The present invention is equally applicable to other semiconductor material rather than the silicon substrate 1 and semiconductor devices wherein the conductivity of the respective layers is the reverse of that shown in FIGS. 3 and 4.

In this manner, high-performance and low-cost $I^2L$ device with desired current gain are manufactured by the relatively simplified process of the present invention. In addition, since a washed emitter method is employed for the collector, the structural pattern may be miniaturized. Short circuits between the collector and the base are avoided because the polycrystal silicon lies over the collector. While only certain embodiments of the present invention have been described, it will be apparent to those skilled in the art that various changes and modifications may be made therein without departing from the spirit and scope of the invention as claimed.

What is claimed is:

1. A method of manufacturing an $I^2L$ (integrated injection logic) composed of complementary transistors one serving as an injector or a source of current and the other serving as an inverter, said method comprising the steps of:

preparing an N+ substrate;

depositing an N-type epitaxial layer over the N+ substrate;

effecting P-type impurity diffusion into a region corresponding to the base of the inverter transistor and a region corresponding to the emitter of the injector transistor;

depositing polycrystal silicon in a manner to cover completely a region corresponding to the collector of the inverter transistor; and simultaneously diffusing an N+ impurity into the collector region and a region corresponding to a collar surrounding the base region of said inverter, thereby forming the N+ collector and the N+ collar with a difference in the diffusion depth because of the existence of the polycrystal silicon in said collector region.

2. The method as defined in claim 1, wherein the polycrystalline silicon is deposited by a chemical vapor-phase growth method.

3. The method as defined in claim 1, wherein the diffusion of the collector and the collar is carried out within an oxidizing atmosphere.

4. The method as defined in claim 1, wherein the remaining polycrystalline silicon is employed as an electrical connection means.

5. The method as defined in claim 1, wherein said N+ substrate comprises an N+ layer buried in a P-type substrate.

6. The method as defined in claim 1, wherein said polycrystalline silicon is formed by an evaporation procedure.

* * * * *